United States Patent
Takasan et al.

(10) Patent No.: US 6,779,650 B2
(45) Date of Patent: Aug. 24, 2004

(54) APPARATUS FOR LEVITATING OBJECTS AND APPARATUS FOR TRANSPORTING OBJECTS

(75) Inventors: Masaki Takasan, Kariya (JP); Tatsuya Uematsu, Kariya (JP); Yoshikazu Koike, Yokohama (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 3 days.

(21) Appl. No.: 10/205,820

(22) Filed: Jul. 26, 2002

(65) Prior Publication Data

US 2003/0034228 A1 Feb. 20, 2003

(30) Foreign Application Priority Data

Jul. 27, 2001 (JP) .......... 2001-228249
Jul. 22, 2002 (JP) .......... 2002-212404

(51) Int. Cl.$^7$ .......... B65G 35/00
(52) U.S. Cl. .......... 198/630; 406/198; 406/51; 406/77; 406/86; 73/570.5
(58) Field of Search .......... 406/51, 77, 85, 406/86, 198; 198/630, 722; 73/570.5

(56) References Cited

U.S. PATENT DOCUMENTS

| | | | |
|---|---|---|---|
| 4,841,495 A | * 6/1989 | Danley et al. | 367/191 |
| 5,036,944 A | * 8/1991 | Danley et al. | 181/0.5 |
| 5,890,580 A | 4/1999 | Hashimoto et al. | 198/619 |
| 5,931,285 A | * 8/1999 | Madsen et al. | 198/762 |
| 6,029,519 A | * 2/2000 | Kuklinski | 73/570.5 |
| 6,336,775 B1 | * 1/2002 | Morita et al. | 406/88 |
| 6,575,669 B2 | * 6/2003 | Takasan | 406/197 |
| 6,609,609 B2 | * 8/2003 | Takasan et al. | 198/630 |
| 6,637,585 B2 | * 10/2003 | Takasan et al. | 198/752.1 |

FOREIGN PATENT DOCUMENTS

| | | | |
|---|---|---|---|
| JP | 7-24415 | 1/1995 | .......... B60B/1/02 |
| JP | 09-169427 | 6/1997 | .......... B65G/47/22 |
| JP | 2001-097531 | 4/2001 | .......... B65G/27/16 |

\* cited by examiner

Primary Examiner—Joe Dillon, Jr.
(74) Attorney, Agent, or Firm—Morgan & Finnegan, LLP

(57) ABSTRACT

An apparatus for levitating objects has an elongated diaphragm and a transducer. The diaphragm has a first end portion and a second end portion. The first end portion is fixed to a horn and the second end portion is fixed to a supporting member. The transducer is connected to only the horn. The transducer vibrates the diaphragm and an object is levitated above a surface of the diaphragm by radiation pressure of a sound wave generated from the diaphragm. Therefore, the elongated diaphragm can be vibrated by one transducer in a stable condition with a simple structure.

13 Claims, 8 Drawing Sheets

APPARATUS FOR LEVITATING OBJECTS AND APPARATUS FOR TRANSPORTING OBJECTS

BACKGROUND OF THE INVENTION

The preset invention relates to an apparatus for levitating objects, an apparatus for transporting objects, and an apparatus for loading objects, and more particularly, to an apparatus for levitating objects, an apparatus for transporting objects, and an apparatus for loading objects for holding an object in a levitated state using a radiation pressure such as a sound wave, transporting an object, a portion of which is in a levitated state, and transferring an object in a levitated state.

Apparatus for levitating objects of this type are disclosed, for example, in Japanese Laid-Open Patent Publications Nos. Hei 7-24415, 9-169427, and the like. As shown in FIG. 11, these apparatuses use an elongated flat diaphragm 75, and an object 76 to be levitated has a flat surface facing the surface of the diaphragm 75. Then, the diaphragm 75 is excited by an exciting mechanism 77 to levitate the object 76 by a radiation pressure of a sound wave generated by vibrations of the diaphragm 75. A horn 78 forming part of the exciting mechanism 77 is coupled to a center portion of the diaphragm 75. The aforementioned publications also disclose that the object 76 is transported in a levitated state by injecting air to the levitated object or by generating a traveling wave by the diaphragm 75 to move the levitated object 76.

When an apparatus for levitating objects is installed on a carrier car for transporting an object in a levitated state to a predetermined position, or when an object is transported to a predetermined position by an apparatus for transporting objects which transports the object in a levitated state, an operation for transferring the object at the predetermined position, i.e., a apparatus for loading objects is required. Japanese Laid-Open Patent Publication No. 2001-97531 discloses a apparatus for loading objects for loading an object in a levitated state, as shown in FIGS. 12(a) and 12(b).

As shown in FIGS. 12(a) and 12(b), a apparatus for loading objects 81 comprises a fork 82 which has a pair of fork pieces that reciprocate linearly. FIG. 12(a) is a schematic back view showing that the apparatus for loading objects is moving to a loading position, and FIG. 12(b) is a schematic back view showing the apparatus for loading objects after the completion of a loading operation. In FIGS. 12(a) and 12(b), each fork piece is arranged to extend perpendicularly to the back surface of the sheet, so that it does not appear on the figure. The fork 82 is arranged for reciprocating linearly in a direction perpendicular to the sheet of FIGS. 12(a) and 12(b) by known driving means (not shown) and is made vertically movable.

Each fork piece is provided with a plurality of apparatus for levitating objects 83. The apparatus for levitating objects 83 has a diaphragm 84 fixed to the fork piece through a horn 85, a transducer 86 and a supporting bracket 87. The apparatus for levitating objects 83 performs an operation for receiving from the apparatus for levitating objects 90 a plate-shaped object 91 held in a levitated state by an apparatus for levitating objects 90 equipped on a truck (not shown) as it remains in the levitated state.

However, in the structure which couples the elongated diaphragm 75 to the horn 78 at the center thereof for vibration as shown in FIG. 11, a deflection caused by the self weight of the diaphragm 75 is problematic. For example, the deflection due to the self weight causes the diaphragm 75 to lose flatness relative to a virtual horizontal plane, and a clearance between a levitated object 76 and the diaphragm 75 to vary. With the employment of a structure which couples the diaphragm 75 to the horn 78 forming part of the vibrating means at a plurality of locations without coupling the diaphragm 75 to the horn 78 at the center thereof, at least two transducers are required, while the adverse influence of the deflection due to the self weight of the diaphragm can be avoided, resulting in a higher cost.

In the apparatus for loading objects 81 illustrated in FIGS. 12(a) and 12(b), a plurality of diaphragms 84 are attached to each fork piece, thereby reducing the adverse influence of a deflection due to the self weight of the diaphragms 84. However, the diaphragms 84 excited by a transducer 86 must be disposed below an object held in a levitated state by another apparatus for levitating objects 90 during a loading operation, so that the apparatus for loading objects 81, with a large distance to the top surfaces of the diaphragms 84, must be introduced from a lower end of the transducer 86. As a result, a large space must be ensured, for example, for permitting the apparatus for loading objects 81 to advance into the apparatus for levitating objects 90. Another problem arises in that the apparatus for loading objects 81 itself is reduced in thickness with difficulties.

SUMMARY OF THE INVENTION

It is a first object of the present invention to provide an apparatus for levitating objects which is capable of vibrating an elongated diaphragm only with a single transducer in a stable state in a simple structure.

It is a second object of the present invention to provide an apparatus for transporting objects for transporting an object, a portion of which is in a levitated state using the above apparatus for levitating objects, in a simple structure.

It is a third object of the present invention to provide a apparatus for loading objects which requires a smaller space for moving a loading unit when an object is transferred in a levitated state.

To achieve the above objects, one aspect of the present invention provides an apparatus for levitating objects. The apparatus for levitating objects has an elongated diaphragm, a horn, a supporting member and a transducer. The diaphragm has a first end portion and a second end portion. The horn is fixed to the first end portion. The supporting member is fixed to the second end portion. The transducer is connected only to the horn. A sound wave is generated in the diaphragm and the transducer vibrates the diaphragm via the horn so that an object is levitated above a surface of the diaphragm by radiation pressure of the generated sound wave.

Another aspect of the present invention provides an apparatus for transporting objects. The apparatus for transporting objects has a transporting mechanism and an apparatus for levitating objects. The transporting mechanism transports an object in a predetermined transporting direction. The transporting mechanism supports the object with two ends of the object in a direction perpendicular to the transporting direction. The apparatus for levitating objects applies levitating force between the two ends of the object supported by the transporting mechanism to prevent deflection of an object. The apparatus for levitating objects has an elongated diaphragm, a horn, a supporting member and a transducer. The diaphragm has a first end portion and a second end portion. The horn is fixed to the first end portion.

The supporting member is fixed to the second end portion. The transducer is connected only to the horn. A sound wave is generated in the diaphragm and the transducer vibrates the diaphragm via the horn so that an object is levitated above a surface of the diaphragm by radiation pressure of the generated sound wave.

Another aspect of the present invention provides an apparatus for loading objects. The apparatus for loading objects has a supporting portion, a movement mechanism, a diaphragm, a horn, a supporting member, a transducer and a driving device. The supporting portion is capable of reciprocating. The supporting portion has a base end portion and a distal end portion. The movement mechanism reciprocates the supporting portion. The diaphragm has a first end portion and a second end portion. The horn fixes the first end portion to the base end portion of the supporting portion. The supporting member fixes the second end portion to the distal end portion of the supporting portion. The transducer is connected to the horn. The driving device vibrates the transducer. A sound wave is generated in the diaphragm and the transducer vibrates the diaphragm via the horn so that an object is levitated above a surface of the diaphragm by radiation pressure of the generated sound wave.

The invention, together with objects and advantages thereof, may best be understood by reference to the following description of the presently preferred embodiments together with the accompanying drawings.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the following, a first embodiment of the present invention will be described with reference to FIGS. 1 and 2(c).

Figure 1:
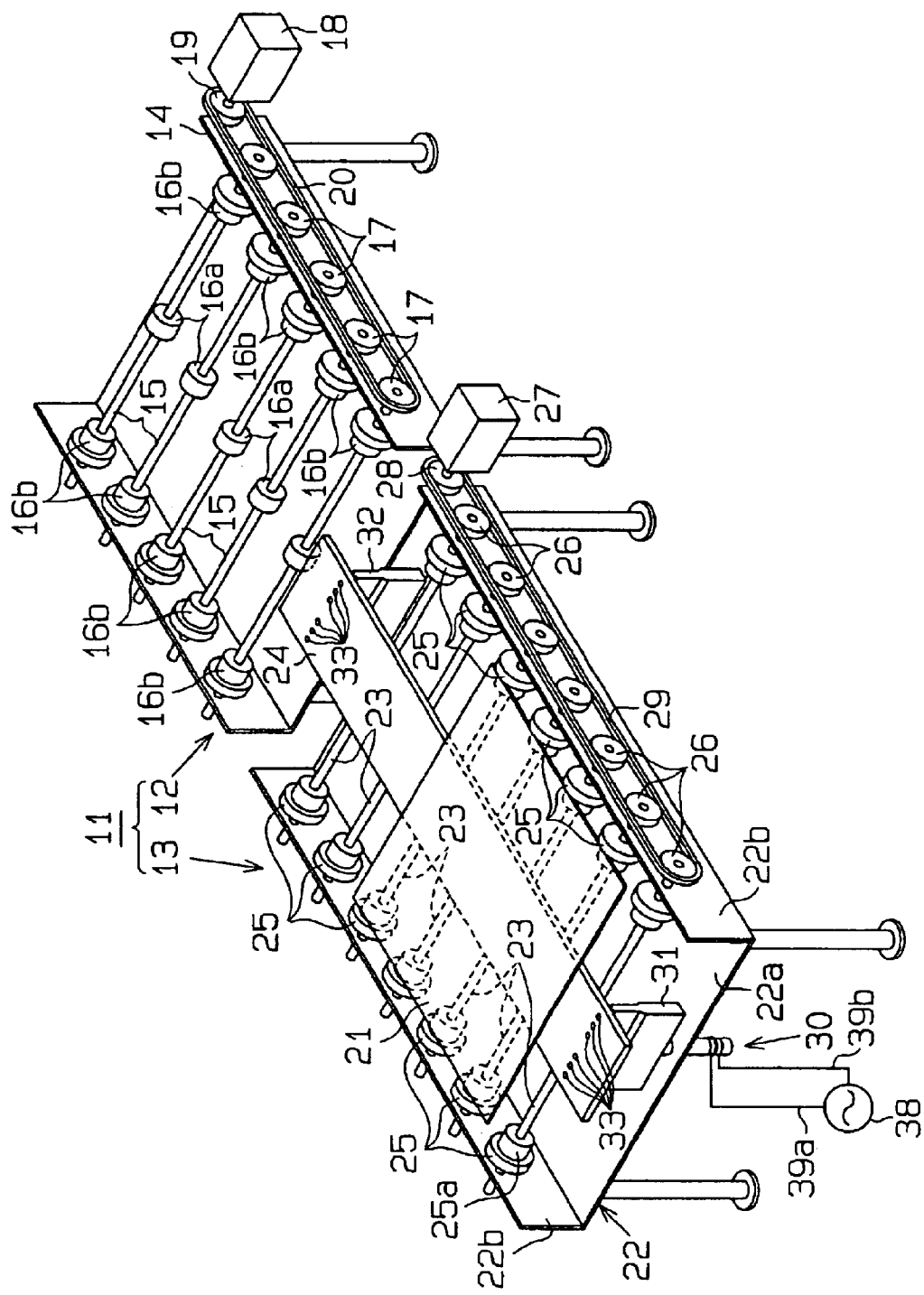
FIG. 1 is a schematic perspective view of a transporting apparatus in a first embodiment of the present invention.

As shown in FIG. 1, a transporting apparatus 11 comprises a roller conveyer apparatus 12 and an apparatus for transporting objects 13. The roller conveyer apparatus 12 comprises a large number of rotary shafts 15 supported by a supporting frame 14 in parallel. Rollers 16a, 16b are integrally rotatably fixed to each rotary shaft 15 at positions corresponding to the vicinities of the center and both sides of the supporting frame 14. A pulley 17 is integrally rotatably fixed to an end of each rotary shaft 15. Each rotary shaft 15 is rotated in a fixed direction (counter-clockwise direction in FIG. 1) by a motor 18 through a belt 20 extended between each pulley 17 and a driving pulley 19 driven by the motor 18. The spacing between the pair of rollers 16b fixed to the rotary shaft 15 is set slightly larger than the width of an object 21 to be transported.

The apparatus for transporting objects 13 comprises a frame 22 which is made up of a base plate 22a and a pair of side walls 22b. Between both side walls 22b, a plurality of rotary shafts 23 are supported in parallel with one another at predetermined intervals. At both ends of the rotary shafts 23 and inside the side walls 22b, a roller 25 is integrally rotatably fixed for moving the object 21 in engagement with both ends of the object 21, the deflection of which is suppressed at the center thereof by the action of a diaphragm 24, which will be described later. The roller 25 has a step 25a which comes in contact with an end of the object 21 to restrict the object 21 from moving in the width direction thereof.

Similar to the rotary shaft 15 of the roller conveyer apparatus 12, a pulley 26 is integrally rotatably fixed to one end of the rotary shaft 23. Each rotary shaft 23 is rotated in a fixed direction (counter-clockwise direction in FIG. 1) by a motor 27 through a belt 29 extended between each pulley 26 and a driving pulley 28 driven by the motor 27.

At the center of the base plate 22a in the width direction, an elongated diaphragm 24 is disposed above the rotary shafts 23 to extend in a direction perpendicular to the rotary shafts 23. The diaphragm 24 is formed in the shape of a rectangular flat plate narrower than the width of the object 21 such that it can hold the object at the center thereof in a levitated state.

The diaphragm 24 has a first end side fixed to a horn 31 excited by a transducer 30, and a second end side fixed to a horn 32 which is not coupled to the transducer 30 and accordingly serves as a fixed supporting member. The horn 31 forming part of vibrating means is fastened to the diaphragm 24 at a distal end thereof with a screw 33. The horn 31 is formed in a flat, substantially rectangular solid shape, and attached to the diaphragm 24, perpendicular to the longitudinal direction thereof, near a longitudinal end of the diaphragm 24.

The horn 31 is fixed to the transducer 30 on a surface opposite to a surface on which the diaphragm 24 is fastened. A distal end surface of the horn 31 is formed in a plane perpendicular to the axial direction of the transducer 30, and is disposed such that the center axis of the horn 31 and transducer 30 extends in the normal direction.

Figure 2A:
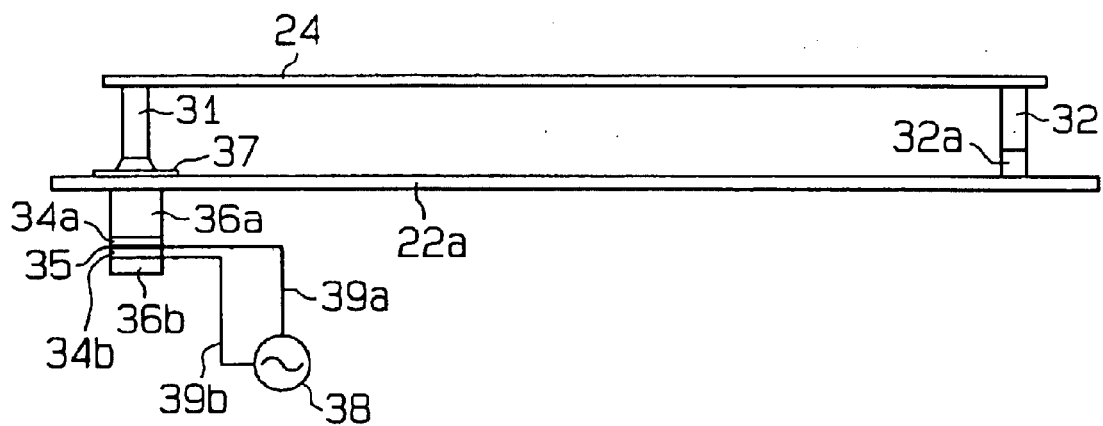
FIG. 2(a) is a partially omitted schematic side view of the apparatus for transporting objects in FIG. 1.
Figure 2B:
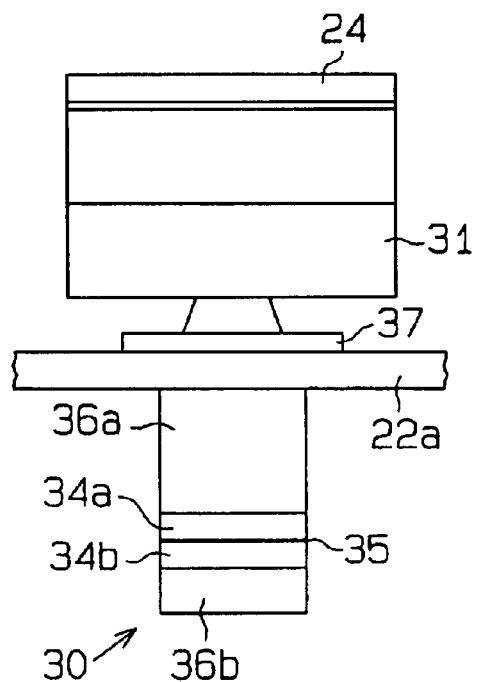
FIG. 2(b) is a schematic front view showing a horn and a transducer.

As shown in FIGS. 2(a) and 2(b), a so-called Langevin transducer is used for the transducer 30 which comprises a pair of annular piezo elements 34a, 34b. An annular electrode plate 35 is disposed between both piezo elements 34a, 34b, and metal blocks 36a, 36b in contact with the surfaces of the piezo elements 34a, 34b opposite to those in contact with the electrode plate 35 are securely fastened by bolts (not shown) to construct the transducer 30. The bolts are screwed into threaded holes (not shown) formed in the metal block 36a from the metal block 36b. Both metal blocks 36a, 36b conduct to each other through the bolts. A flange 37 (shown in FIGS. 2(a) and 2(b)) is formed at an upper end of the metal block 36a, and the metal block 36a is fixed to the base plate 22a by bolts (not shown) as it is fitted in a hole (not shown) formed in the base plate 22a.

The transducer 30 is connected to an oscillator 38, which functions as a driver. The electrode plate 35 is connected to the oscillator 38 through a wire 39a, and a ground terminal of the oscillator 38 is connected to the metal block 36b through a wire 39b. The horn 31, transducer 30, and oscillator 38 comprise exciting means for exciting the diaphragm 24.

FIG. 2(a) is a schematic side view of the apparatus for transporting objects 13 which omits the side wall 22b, rotary shafts 23, rollers 25 and the like for showing how the diaphragm 24 is supported; FIG. 2(b) is a schematic front view of the horn 31; and FIG. 2(c) is a schematic front view of the horn 32. As shown in FIG. 2(c), the horn 32 is formed in a flat, substantially rectangular solid shape, and a cylindrical cone 32a is integrally fixed to a lower surface of the horn 32. The horn 32 has a length of $n\lambda/2$ ($\lambda$ is the length of vibrating wavelength (vibrating wavelength of vertical vibrations of the horn 32), and n is a natural number) in a direction perpendicular to the diaphragm 24. Then, the cone 32a is fixed to the base plate 22a at a distance of $\lambda/4$ from the lower surface of the horn 32.

The frame 22, diaphragm 24, horn 31, transducer 30, oscillator 38, and horn 32 comprise an apparatus for levitating objects.

Next, the action of the apparatus constructed as described above, will be described.

The transporting apparatus 11 transports a glass plate as the object 21 from the roller conveyer apparatus 12 to the apparatus for transporting objects 13. The roller conveyer apparatus 12 is installed in a process of washing the object 21, so that the object 21 receives a washing liquid injected from a shower (not shown) while it is transported by the roller conveyer apparatus 12, and is passed to the apparatus for transporting objects 13 after washing. The apparatus for transporting objects 13 is installed in a drying process which receives the washed object 21 from the roller conveyer apparatus 12 for transportation.

During the operation of the transporting apparatus 11, the motor 18 is driven to rotate the rotary shafts 15 through the driving pulley 19, belt 20, and pulley 17. The rollers 16a, 16b are also rotated in a predetermined direction. As a result, the object 21 carried on the rollers 16a, 16b of the roller conveyer apparatus 12 is transported to the apparatus for transporting objects 13 side, associated with the rotations of the rollers 16a, 16b.

In the apparatus for transporting objects 13, the motor 27 is driven to rotate the rotary shafts 23 in a fixed direction through the driving pulley 28, belt 29, and pulley 26. The roller 25 is also rotated in a predetermined direction. Also, the transducer 30 is excited at a predetermined resonant frequency (for example, at 20 kHz more or less) to cause the horn 31 to vertically vibrate to excite the diaphragm 24 to produce deflection vibration, resulting in a standing wave. A center portion of the object 21 levitates from the surface of the diaphragm 24 by a radiation pressure of a sound wave radiated from the diaphragm 24. A levitating distance is, for example, in a range of several tens to several hundreds $\mu m$. Both ends of the object 21 are held in contact with the roller 25. Then, the object 21 is applied with a thrust by the rotation of the roller 25, and the object 21 is transported along the side wall 22b.

When the object 21 is supported by the roller 25 on both left and right ends during transportation, without holding the object 21 in a levitated state using the diaphragm 24, a stable transportation is difficult because the object 21 is wide and is accordingly susceptible to deflection. However, in this embodiment, the object 21 is given a thrust by the roller 25 to move, with its center portion maintained in a levitated state, by the standing wave generated by the diaphragm 24, so that the object 21 is stably transported along the transportation path.

When the transporting apparatus 11 is applied to transportation of a thin glass plate, for example, as the object 21, the end portions of the object 21 are susceptible to stain and scratch since they are always in contact with the roller 25. However, this will not cause any problem since the end portions of the glass plate are not used in a product at the final stage.

The foregoing embodiment provides the following advantages.

(1) The exciting means for exciting the elongated diaphragm 24 fixes the first end of the diaphragm 24 to the horn 31 excited by the transducer 30, and the second end to the fixed supporting member (horn 32) to which the transducer is not coupled. Thus, the diaphragm 24 is fixed at two locations to reduce the adverse influence of the deflection due to the self weight, unlike the diaphragm fixed at one location. In addition, the structure is simplified with a lower manufacturing cost, as compared with the exciting means which requires two transducers 30. Further, alignment adjustments are facilitated.

(2) Since the elongated diaphragm 24 is fixed to the horns 31, 32 such that its ends are free, a standing wave is generated even outside the positions at which the horns 31, 32 are fixed. Therefore, the object 21 is smoothly transferred at a junction with the roller conveyer apparatus 12, as compared with the horns 31, 32 which are fixed to the diaphragm 24 such that its ends are not free.

(3) The horn 32 not coupled to the transducer is formed to have a length of $n\lambda/2$ ($\lambda$ is the length of vibrating wavelength, and n is a natural number) in a direction perpendicular to the diaphragm 24. Thus, the horn 32, which is not coupled to the transducer, readily resonates, and the diaphragm 24 readily vibrates to stably generate the standing wave which levitates the object 21.

(4) The diaphragm 24 is excited to generate the standing wave. Thus, the diaphragm 24 need not generate a traveling wave, so that the standing wave is generated in a simple structure without the need for a special structure.

(5) The apparatus for transporting objects 13 comprises transporting means for transporting the object 21 supported at both left and right ends in the transporting direction, and the apparatus for levitating objects for applying a levitating force to the object supported by the transporting means to suppress its deflection. The apparatus for levitating objects, the diaphragm 24 has the first end side fixed to the horn 31 vibrated by the transducer 30, and the second end side fixed to the horn 32 which is not coupled to the transducer 30. Thus, the apparatus for levitating objects is simple in structure, and the apparatus for transporting objects is also simple in structure.

(6) The diaphragm 24 is arranged in a horizontal position, and the roller 25 bears the object 21 at both left and right ends toward the traveling direction. Thus, the object 21 has its both left and right ends always in contact with the roller 25, so that the object 21 can be transported in a more stable state, even if the object 21 is wide.

Next, a second embodiment of the present invention will be described with reference to FIGS. 3 to 5(b). This embodiment largely differs from the first embodiment in that the apparatus for levitating objects of the foregoing embodiment is applied to a apparatus for loading objects. Parts similar to the foregoing embodiment are designated the same reference numerals, and detailed description thereon is omitted.

Figure 3:
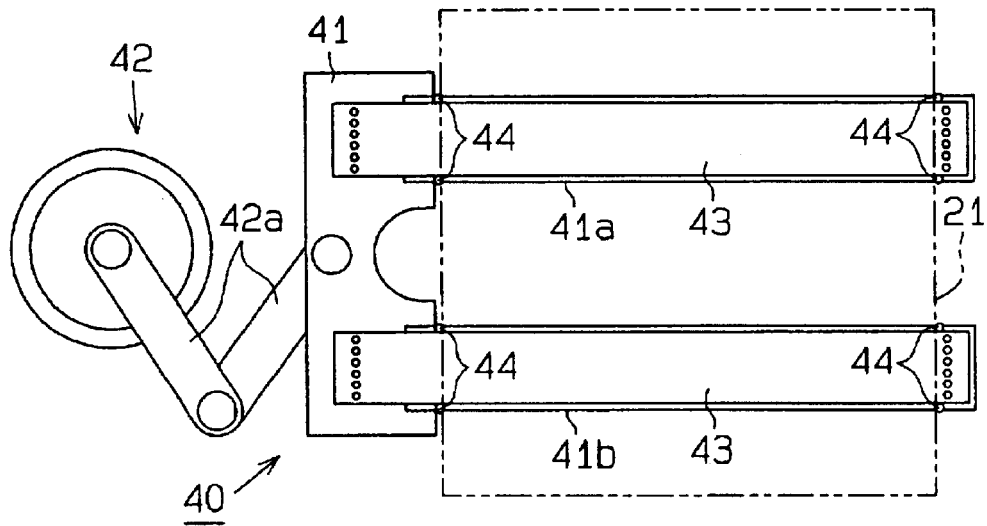
FIG. 3 is a schematic top plan view of a apparatus for loading objects according to a second embodiment of the present invention.
Figure 4A:
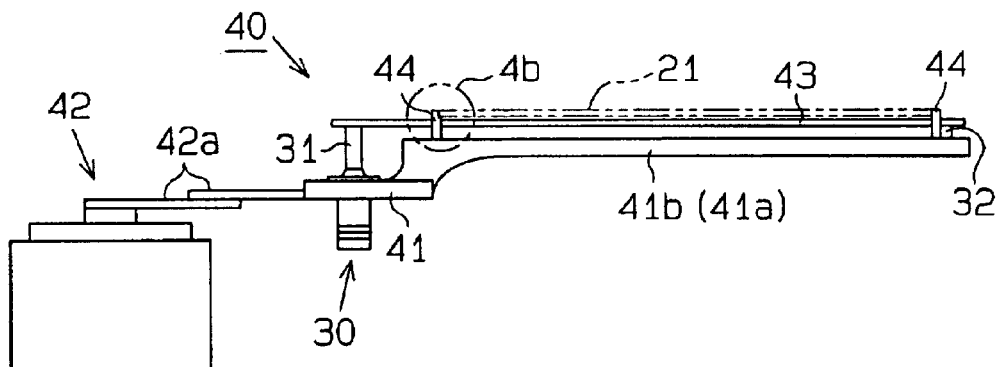
FIG. 4(a) is a schematic side view of the apparatus in FIG. 3.
Figure 4B:
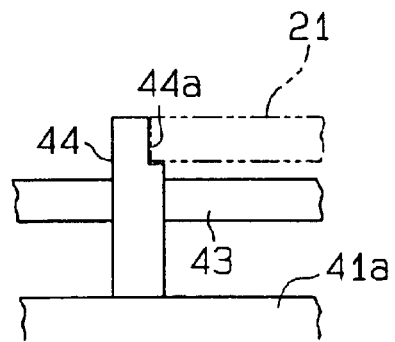
FIG. 4(b) is an enlarged view of section 4b in FIG. 4(a)

FIG. 3 is a schematic top plan view of a apparatus for loading objects; FIG. 4(a) is a schematic side view; and FIG. 4(b) is an enlarged view of a portion 4b in FIG. 4(a).

As shown in FIG. 3, the apparatus for loading objects 40 comprises a linearly reciprocating support 41, and moving means 42 for linearly reciprocating the support 41. The support 41 is formed integrally with arms 41a, 41b, as a pair of forks, extending in parallel. Distal ends of the arms 41a, 41b are the distal end of the support 41. A diaphragm 43 has a first end fixed to the support 41 through a horn 31 which is excited by a transducer 30, and a second end fixed to the distal end of the arm 41a, 41b through a horn 32. The transducer 30 is connected to an oscillator 38, not shown.

Restricting members 44 are fixed near the proximal ends and distal ends of the arms 41a, 41b for restricting the object 21 from relatively moving in a direction in which the arms 41a, 41b are moved (longitudinal direction) when the object 21 is loaded. As shown in FIG. 4(b), each restricting member 44 comprises a pin formed with a stopping recess 44a in an upper portion. The lower end of the pin is fixed to the arms 41a, 41b.

The moving mechanism 42 comprises a known scalar type robot arm having links 42a, 42b, and linearly reciprocates the support 41 with a driving mechanism (not shown) and is made vertically movable. The apparatus for loading objects 40 comprises a sensor (not shown) for confirming the height of the arms 41a, 41b.

Figure 5A:
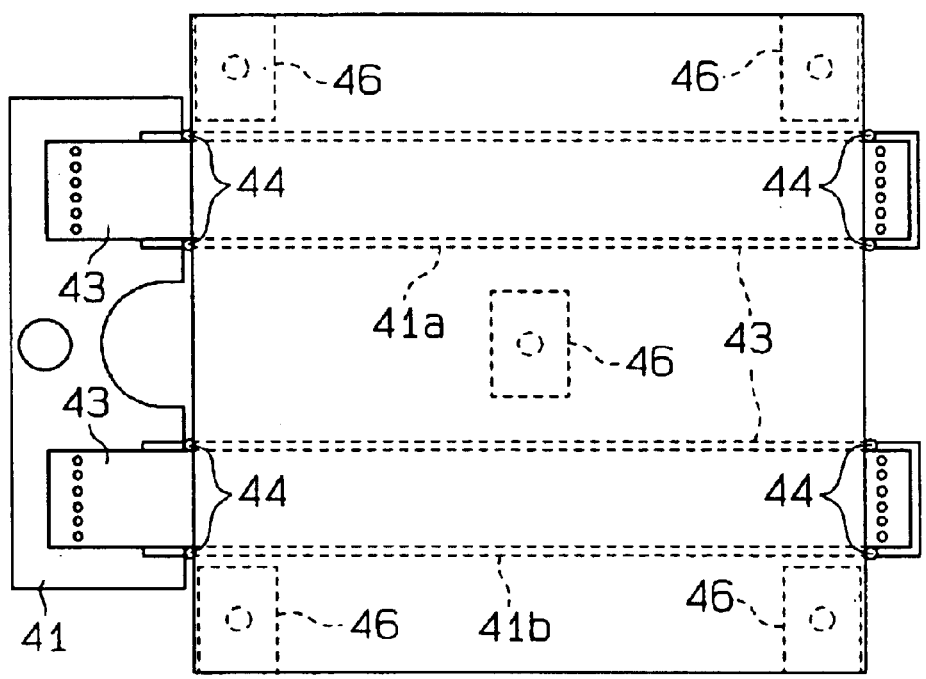
FIG. 5(a) is a partially omitted schematic top plan view showing the apparatus of FIG. 3 when it loads an object.
Figure 5B:
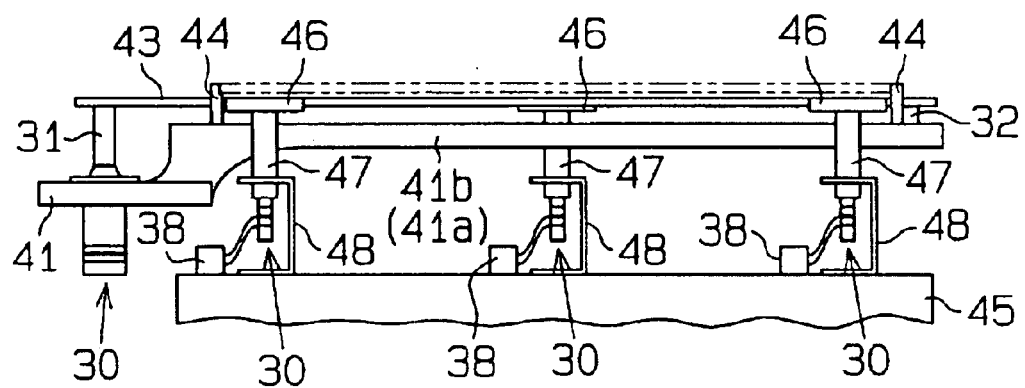
FIG. 5(b) is a partially omitted schematic front view of the apparatus of FIG. 3.

FIG. 5(a) is a schematic top plan view of the apparatus for loading objects 40 when an object is loaded. In FIG. 5(a), the moving mechanism 42 is omitted from the apparatus for loading objects 40. FIG. 5(b) is a schematic side view of FIG. 5(a). As shown in FIG. 5(b), the truck 45 is equipped with the apparatus for levitating objects for holding the object 21 in a levitated state with a plurality (five in this embodiment) of transducers 46. The vibrating elements 46 are formed in a rectangular plate shape, and four vibrating elements 46 are disposed at positions corresponding to the four corners of the object 21 in a rectangular plate shape, and one vibrating element 46 is disposed at a position equidistant from the four vibrating elements 46. A horn 47 forming part of the exciting means is fastened to a distal end of each vibrating element 46 with a screw, not shown.

As shown in FIG. 5(b), the horn 47 is formed in a cylindrical shape, and attached perpendicular to each vibrating element 46 at the center of each vibrating element 46. Each vibrating element 46 has its surface arranged in a horizontal position. Each horn 47 is fixed to the transducer 30 on the surface opposite to the surface on which the vibrating element 46 is fastened. The horn 47 is attached on the truck 45 through a supporting bracket 48. Each transducer 30 is fixed to the supporting bracket 48 such that each vibrating element 46 is positioned in a horizontal position. Each transducer 30 is connected to the oscillator 38.

Next, the operation of the apparatus constructed as described above, will be described.

As the object 21 is transported in a levitated state to a target position by the apparatus for levitating objects installed on the truck 45, the apparatus for loading objects 40 performs an object loading operation. As the truck 45 is stopped with the object 21 held in a levitated state at a predetermined position, the arms 41a, 41b are driven to introduction preparatory positions. At these positions, the distal end of the restricting member 44 is positioned below the lower surface of the object 21. From this state, the moving mechanism 42 is driven to move the support 41 in front to a loading position corresponding to the object 21. Subsequently, the support 41 is moved up to a predetermined position. Then, the object 21 is held in a levitated state by a standing wave generated from the diaphragm 43. Then, after the arms 41a, 41b are moved up to a predetermined height at which substantially no influence is exerted by the levitating force of the vibrating elements 46 of the apparatus for levitating objects on the truck 45, the support 41 is retracted, and the object 21 is moved from the apparatus for levitating objects. Then, after the arms 41a, 41b are retracted to predetermined positions corresponding to a carrier (not shown) the arms 41a, 41b are moved down to transfer the object to the carrier.

The foregoing embodiment provides the following advantages.

(7) The diaphragm 43 for holding the object 21 in a levitated state is excited at the proximal end by one transducer 30, with the distal end fixed to the horn 32. Therefore, the diaphragm 43 is excited in a simple structure, and a required space can be reduced for the fork to load the object 21 in a levitated state.

(8) Since the arms 41a, 41b are provided with the restricting member 44 for restricting the object 21 in a levitated state from relatively moving in the direction in which the arms 41a, 41b are moved, the loading operation is smoothly performed even when the object 21 is moved faster, as compared with the arms not provided with the restricting member 44.

(9) As compared with the horn 31 coupled to the diaphragm 43 at the proximal end of the support 41, the horn 32 coupled to the diaphragm 43 at the distal ends of the arms 41a, 41b is shorter, thereby reducing the level from the lower surfaces of the arms 41a, 41b to the upper surface of the diaphragm 43.

Next, a third embodiment will be explained with referring to FIGS. 6(a) and 6(b). In the third embodiment, the apparatus for levitating objects of the present invention is installed on a truck 45. In the third embodiment, the apparatus for levitating objects almost same as that of FIGS. 1 to 2(c) is installed on the truck 45. Same numerals are applied to the same portions as in the embodiments of FIGS. 1 to 2(c) and the explanation thereof is omitted.

Figure 6A:
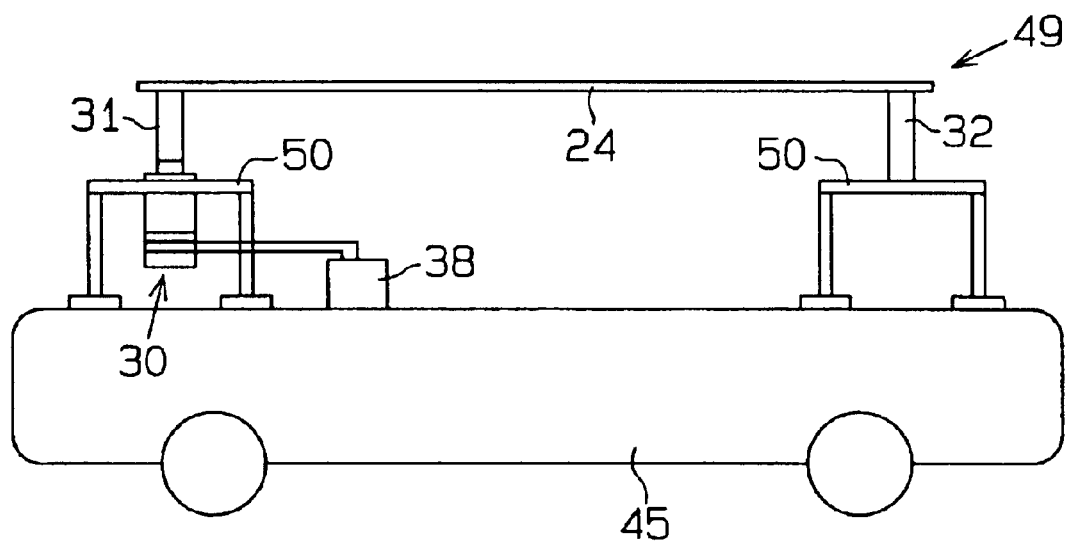
FIG. 6(a) is a schematic side view of an apparatus for transporting objects according to a third embodiment of the present invention.
Figure 6B:
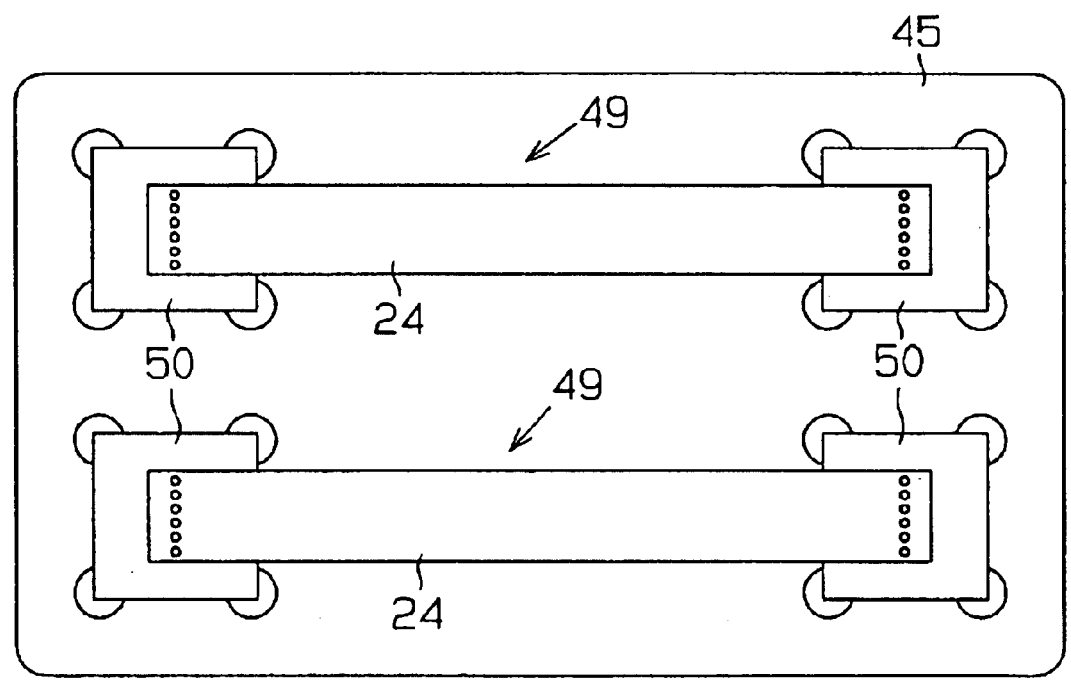
FIG. 6(b) is a schematic top plan view of the apparatus in FIG. 6(a)

As shown in FIGS. 6(a), 6(b), two apparatus for levitating objectses 49 are installed on a truck 45. The truck 45 is provided with two sets of supports 50, where a horn 31 is fixed to a transducer 30 fixed to one support 50, while a horn 32 is fixed to the other support 50. A diaphragm 24 has one end fixed to the horn 31, and a second end fixed to the horn 32. In this structure, a standing wave is generated as well by the diaphragm 24 excited at one end by the transducer 30 through the horn 31, so that an object (not shown) can be stably held in a levitated state. By moving the truck 45, an object to be transported can be held in a levitated state and transported to a predetermined position.

Next, a fourth embodiment of the present invention will be explained with reference to FIGS. 7(a) to 8. The transporting apparatus 13 of the fourth embodiment is different from that of the embodiments in FIGS. 1 to 2(c). The diaphragm 24 comprising the apparatus for transporting objects 13 is not a simple flat plate and special processing is applied to the diaphragm 24 of the fourth embodiment. In the fourth embodiment, special processing is applied to the horn 31 comprising the transducer 30. Same numeral is applied to the same portions as the embodiments of FIGS. 1 to 2(c) and the explanation thereof is omitted.

Figure 7A:
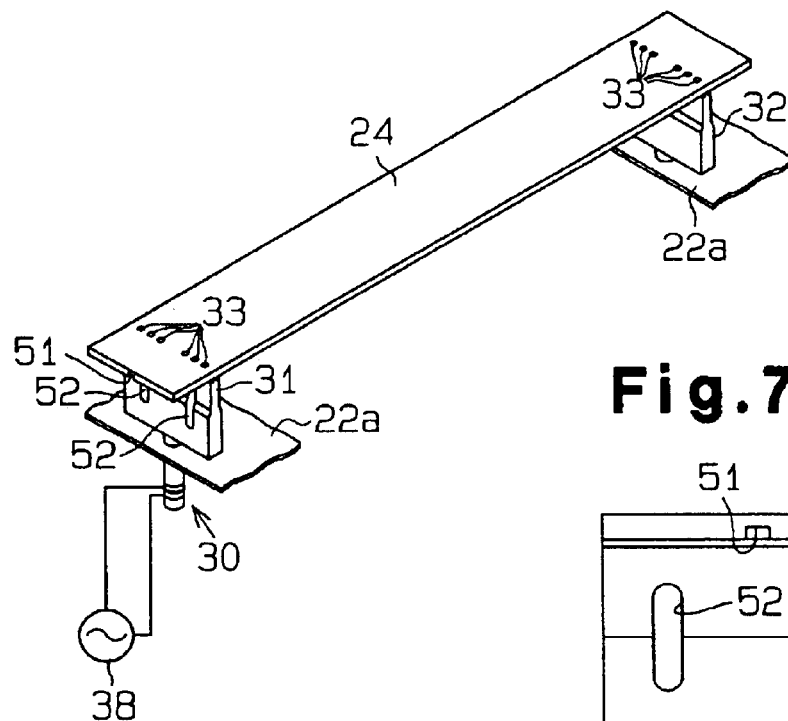
FIG. 7(a) is a schematic perspective view of an apparatus for transporting objects according to a fourth embodiment of the present invention.
Figure 7B:
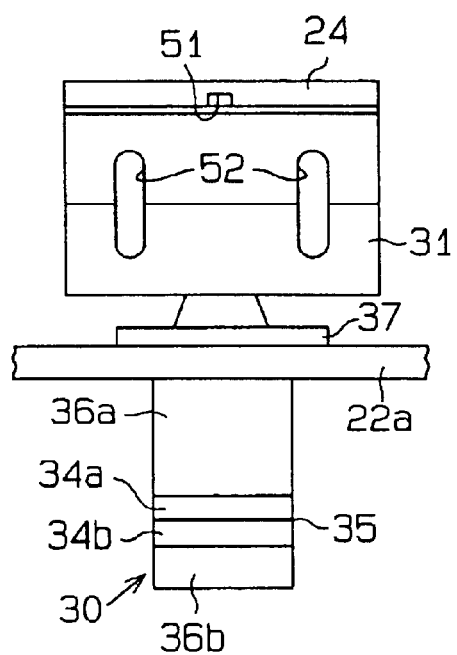
FIG. 7(b) is a schematic front view showing a horn and a transducer of the apparatus shown in FIG. 7(a)
Figure 8:
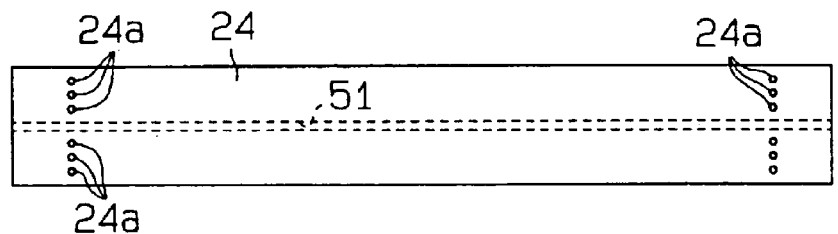
FIG. 8 is a plan view showing a diaphragm in the apparatus shown in FIG. 7(a)

As shown in FIGS. 7(a) to 8, a groove 51 is formed on the diaphragm 24 so as to extend along a longitudinal direction of the diaphragm 24. In the fourth embodiment, one groove 51 is formed at a center of a lower surface of the diaphragm 24. The groove 51 extends over a longitudinal length of the diaphragm 24. The groove 51 is formed so as to avoid holes 24a (see FIG. 8) where a screw 33 is penetrated for fixing the diaphragm 24 to the horns 31, 32. That is, the hole 24a is not formed at a center in the width direction of the diaphragm 24.

The horns 31, 32 are formed with the same width as that of the diaphragm 24. A plurality of slits (two in the fourth embodiment) extending along a vibration direction of the horn are formed in each horn 31, 32. The slits 52 are formed so as to divide equally the horn 31, 32 in its width direction.

The transducer 30 is excited at a predetermined resonant frequency (for example, at about 20 kHz) to cause the horns 31, 32 to vertically vibrate and the diaphragm 24 is excited via the horns 31, 32 to produce deflection vibration. The diaphragm 24 is excited by the transducer 30 arranged on a first end portion of the diaphragm 24. A second end portion of the diaphragm 24 is fixed to the horn 32, which is a fixed supporting member. In this structure, when a shape of the diaphragm 24 is simple rectangular, crack is easily caused in a free end portion of the diaphragm 24 as a result of an experiment compared to a case when the transducer is connected to both ends of the diaphragm 24 and the diaphragm 24 is excited. The crack is easily generated because stress is concentrated in the free end portion of the diaphragm 24 (a portion between the fixed portion fixed by the screw 33 and the end portion of the diaphragm 24). The stress is concentrated in the free end portion, because the free end portion is not vibrated in a stripe vibration mode but in a lattice vibration mode even if the diaphragm 24 is excited so as to be vibrated in the stripe vibration mode.

However, when the groove 51 extending along the longitudinal direction of the diaphragm 24 is formed in the diaphragm 24, the vibration of the diaphragm 24 in its width direction is prevented. The diaphragm 24 is easily vibrated in the stripe vibration mode over the entire length of the diaphragm 24 in its longitudinal direction and the free end portion is vibrated in the stripe vibration mode.

Since the slit 52 is formed in the horns 31, 32 extending along the vibration direction of the horns 31, 32, only vertical vibration is transported from the transducer 30 to the horn 31. As a result, when vibration is transported from the transducer 30 of a cylindrical shape to the diaphragm 24 via the horn 31 of a prismatic shape, the vibration wave is transported uniformly and the free end portion of the diaphragm 24 is vibrated in the stripe vibration mode.

Figure 2C:
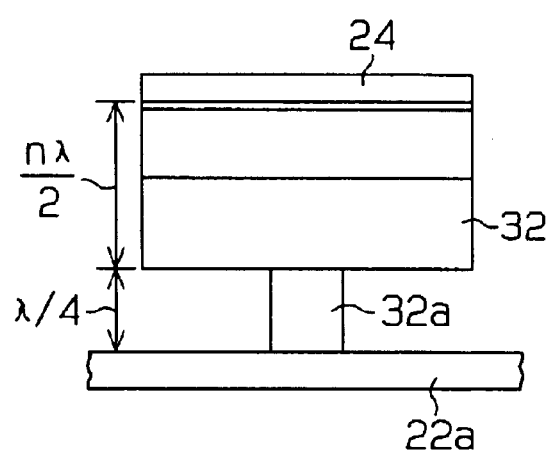
FIG. 2(c) is a schematic front view of a horn different from that shown in FIG. 2(b)

The following advantages are obtained in the fourth embodiment in addition to the advantages of (1) to (6) according to the embodiment of FIGS. 1 to 2(c).

(10) Since the groove 51 is formed in the elongated diaphragm 24 and extending along a longitudinal direction of the diaphragm 24, it is prevented that the diaphragm 24 is vibrated in its width direction and the lattice vibration mode is not caused in the free end portion of the diaphragm 24, and therefore, crack is hardly caused. Since the free end portion of the diaphragm 24 is vibrated in the stripe vibration mode, amplitude of vibration in the free end portion is maintained.

(11) The groove 51 is continuously formed over the entire length in the longitudinal direction of the diaphragm 24. Therefore, processing of the groove 51 is easy compared to a case when a plurality of short grooves are processed in straight.

(12) Since the slit 52 is formed extending along the vibration direction of the horns 31, 32, only vertical vibration is transported from the transducer 30 to the horns 31, 32. As a result, the diaphragm 24 is easily vibrated in the stripe vibration mode, and the lattice vibration mode is not caused in the free end portion of the diaphragm 24, and therefore crack is hardly caused. Since the free end portion of the diaphragm 24 is vibrated in the stripe vibration mode, amplitude of vibration in the free end portion can be maintained.

It should be apparent to those skilled in the art that the present invention may be embodied in many other specific forms without departing from the spirit or scope of the invention. Particularly, it should be understood that the invention may be embodied in the following forms.

When the diaphragms 24, 43 are fixed to the horns 31, 32, the diaphragms 24, 43 may be fixed to the horns 31, 32 at their ends such that the diaphragms 24, 43 do not have free ends. In this structure, a standing wave is generated as well by vibrations of the diaphragms 24, 43, so that the object 21 can be levitated. However, when connected in series with another transporting apparatus to move the object 21 from one transporting apparatus to another, as in the first embodiment, the diaphragm 24 is preferably fixed to the horns 31, 32 such that the diaphragm 24 has free ends.

The horn 32 may be fixed to the base plate 22a such that the base plate 22a is spaced by a distance of $n\lambda/2$ without providing the cone 32a in the first embodiment. Also, in this case, the whole diaphragm 24 can be excited by one transducer 30 without coupling the horn 32 to the transducer.

The length of the horn 32 as a fixing member, to which no transducer is coupled, may not be necessarily set to $n\lambda/2$ ($\lambda$ is the length of vibrating wavelength, and n is a natural number).

The apparatus for transporting objects 13 shown in FIGS. 1 to 2(c) may be used alone, rather than in combination with the roller conveyer apparatus 12. When the object 21 is transported over a long distance, a plurality of apparatus for transporting objects 13 may be connected in series to form a transporting apparatus.

In the apparatus for transporting objects 13 comprising transporting means for transporting the object 21 supported at both left and right ends in the transporting direction, as in the embodiment of FIGS. 1 to 2(*c*), a plurality of diaphragms 24 may be arranged in parallel. In this structure, the object 21 to be transported can be transported in a stable state even if it has a large width.

In the embodiment of FIGS. 1 to 2(*c*), as the transporting means for transporting the object 21 supported at both left and right ends in the transporting direction, a belt may be in contact with the object 21, in place of the rollers 16*a*, 16*b* which are in contact with the object 21. In this case, the rotary shafts 23 can be arranged at wider intervals to reduce the number of parts (for example, the number of rotary shafts 23).

In the apparatus for loading objects shown in FIGS. 3 to 5(*b*), the moving mechanism 42 comprising the known scalar type robot arm having a plurality of links 42*a* may be replaced with a multi-stage fork apparatus which comprises a base, and a plurality of movable forks which can be horizontally fed out relative to the base, wherein the support 41 is fixed to a final-stage fork of the multi-stage fork apparatus.

The installation of the apparatus for loading objects 40 is not limited to the structure where it is installed at a predetermined position, but it may be installed on a carrier car which moves along a rail, a carrier car which moves along a path without a rail, and the like. In this case, one apparatus for loading objects 40 can be used at a plurality of locations.

When the diaphragms 24, 43 are long and have large deflections, a deflection suppressing mechanism may be provided for bearing center portions of the diaphragms 24, 43 from below. In this case, an excessive deflection is avoided, the diaphragms 24, 43 vibrate in a stable state, and a levitating force stably acts on the object 21.

The restricting member 44 may not be formed with the stopping recess 44*a*, but a simple pin may be used instead. Also, a holder having a weak sucking action may be provided as the restricting means 44 to restrict movements of the object 21.

Instead of generating a standing wave from the diaphragm 24, a traveling wave may be generated. For example, the horn 32 is fixed to the base plate 22*a* through a rubber having a large energy absorbing capability. The intensity of the traveling wave is weak as compared with a wave which is generated when the transducer is fixed to the horn 32 and a load circuit is connected to the transducer. However, an object can be transported by the traveling wave when the object to be transported is light. Even with a weak traveling wave, the existence of the traveling wave acts as an auxiliary thrust for transporting an object, thereby making it possible to reduce a thrust required by the transporting means.

In the embodiment of FIGS. 7(*a*) to 8, the number of the groove 51 formed in the diaphragm 24 is not limited to one but may be more. The number of the groove 51 is determined such that width of each portion divided by the groove 51 becomes smaller than ⅓ of wavelength of the vertical vibration of the horn 31, 32. When a plurality of grooves 51 are formed, it is preferable that each groove 51 is formed symmetrical to a line that is center in width direction of the diaphragm 24.

In the embodiment of FIGS. 7(*a*) to 8, the groove 51 need not be formed on the lower surface of the diaphragm 24 but may be formed on an upper surface or both of the upper and lower surfaces of the diaphragm 24. When the groove is formed on the upper surface, radiant quantities of sound pressure generated from the diaphragm 24 becomes small. Therefore, it is preferable that the groove is formed on the lower surface.

The groove 51 is not necessarily formed over a entire length of the diaphragm 24 but may be partially formed on the diaphragm 24. For example, a plurality of relatively long grooves may be formed or a plurality of short grooves may be formed.

The number of the slit 52 formed in the horn 31, 32 is not limited to two but may be one or more than or equal to three according to a width, thickness or a length of the horn 31, 32. The number of the slits 52 may be odd or even.

Figure 9:
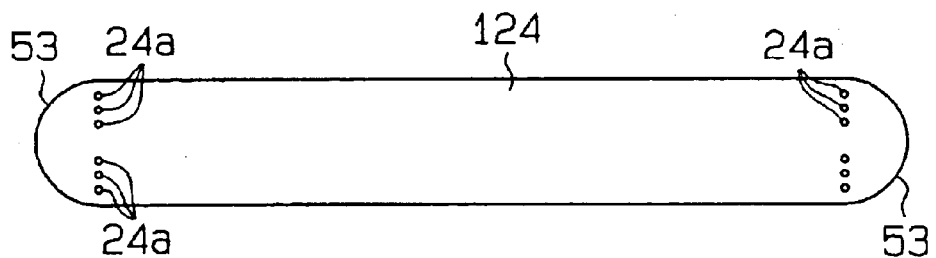
FIG. 9 is a plan view showing a diaphragm according to another embodiment.

For preventing stress from concentration in the free end portion of the diaphragm 24, the groove 51 and the slits 52 may be formed and also the end portion of the diaphragm 24 may be chamfered or may be processed in an arc shape. For example, as in another embodiment shown in FIG. 9, an arc portion 53 of a plane arc is provided on each end portion of a diaphragm 124 and the groove 51 is omitted. Since the arc portion 53 is formed at least either one of the end portions in the longitudinal direction of the diaphragm 124, the stress concentration is hardly caused in the free end portion of the diaphragm 24 and generation of crack is prevented. The free end portion of the diaphragm 24 is easily vibrated in the stripe vibration mode. As a result, compared to a case when the free end portion of the diaphragm 24 is vibrated in the lattice vibration mode, the stress concentration is hardly caused in the free end portion of the diaphragm 24. Without providing the groove 51 in the diaphragm 24 and the stress concentration can be prevented only by the arc portion 53. The stress concentration can be prevented more certainly when the groove 51 is formed on the diaphragm 24 or the slits 52 are formed in the horn 31, 32.

Figure 10A:
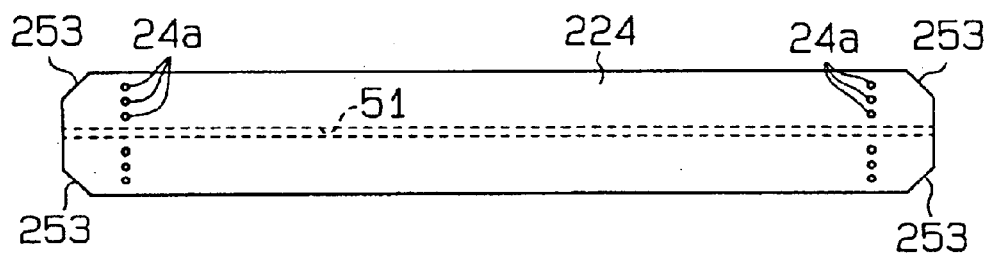
FIG. 10(a) is a plan view showing a diaphragm according to another embodiment.
Figure 10B:
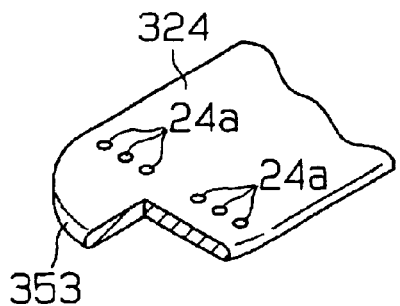
FIG. 10(b) is a partially cutaway schematic perspective view showing a diaphragm according to another embodiment.
Figure 10C:
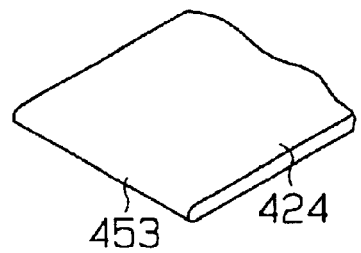
FIG. 10(c) is a partially cutaway schematic perspective view showing a diaphragm according to another embodiment.
Figure 11:
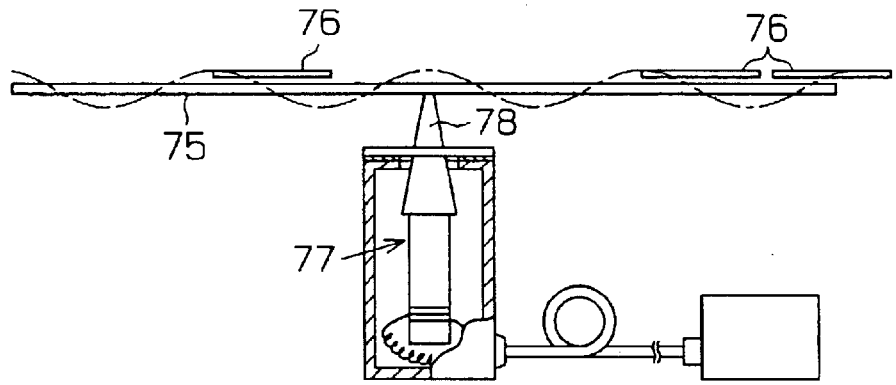
FIG. 11 is a partially cutaway schematic side view of a conventional apparatus for levitating objects.
Figure 12A:
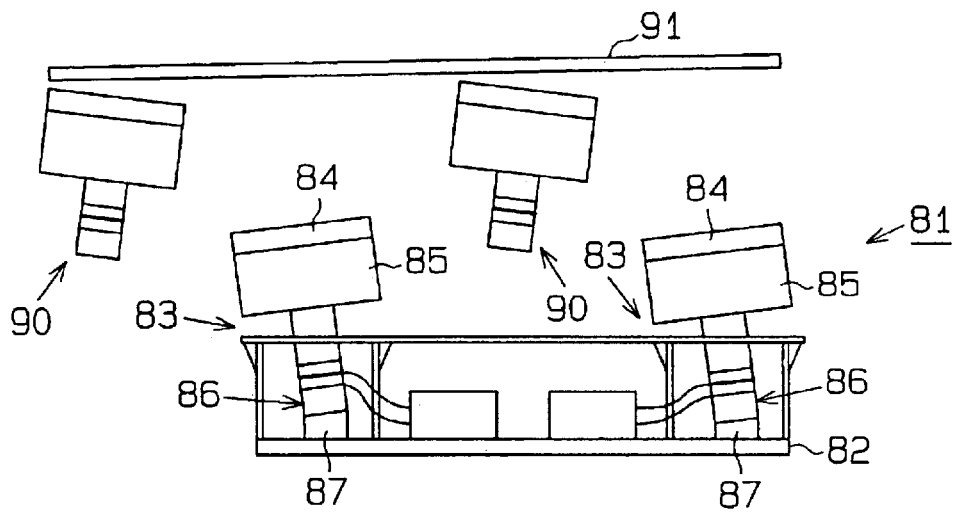
FIG. 12(a) is a schematic back view showing that another conventional apparatus for loading objects is moving to a loading position.
Figure 12B:
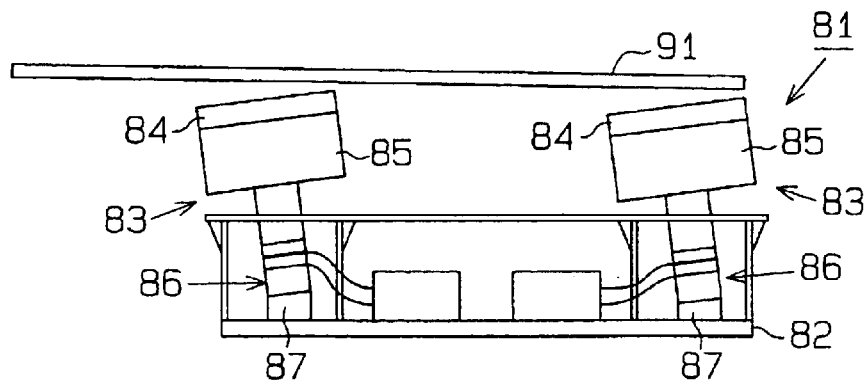
FIG. 12(b) is a schematic back view showing the apparatus for loading objects in FIG. 12(a) when it has loaded an object.

As in another embodiment shown in FIG. 10(*a*), each corner of the end portion of a diaphragm 224 that is plane rectangular may be cut off to form a chamfered portion 253. As in another embodiment shown in FIG. 10(*b*), the end portion of a diaphragm 324 may be processed in a shape of a plane arc. An end portion 353 of the diaphragm 324 may be processed in a curvature (arc) in width direction of the diaphragm 324 or chamfered. As in another embodiment shown in FIG. 10(*c*), a plane shape of a diaphragm 424 may be rectangular and an edge of an end portion 453 may be chamfered or processed in a curvature in its width direction. With the end portion 453, generation of crack caused in the free end portion of the diaphragm 424 due to the stress concentration is prevented.

As means for preventing stress from concentrating in the free end portion of the diaphragm 24, the groove 51 may be formed in the diaphragm 24. The arc portion 53, the chamfered portion 253 or the end portion 353, 453 where the curvature processing is applied is not necessarily formed in the diaphragm 24, 124, 224, 324, 424, where the first end portion is excited by the horn 31 connected to the transducer 30 and the second end portion is connected to the horn 32 that is a fixed supporting member. That is, the means for preventing stress concentration may be applied to a diaphragm that is connected to a horn that is excited by a transducer in both end portions.

The groove 51, the arc portion 53, the chamfered portion 253 or the end portion 353, 453 where the curvature processing is applied may be provided in the diaphragm 43 of the embodiment of FIGS. 3 to 5(*b*) or the diaphragm 24 of the embodiment of FIGS. 6(a) and 6(b), and the slit 52 may be formed in both horns 31 and 32. In these cases, generation of crack caused in the free end portion of the diaphragm 24, 43 is prevented.

The diaphragms 24, 124, 224, 324, 424 may be fixed to the horns 31, 32 by using an adhesive, not limited to fastening by screws. Alternatively, the diaphragm 24 may be secured by brazing or welding.

Not limited to the Langevin transducer, another transducer may be used for the transducer 30.

What is claimed is:

1. An apparatus for levitating objects comprising:

an elongated diaphragm having a first end portion and a second end portion;

a horn fixed to the first end portion;

a supporting member fixed to the second end portion; and a transducer connected only to the horn, wherein a sound wave is generated in the diaphragm and the transducer vibrates the diaphragm via the horn such that an object is levitated above a surface of the diaphragm by radiation pressure of the generated sound wave.

2. The apparatus for levitating objects according to claim 1, wherein a length of the supporting member in a direction perpendicular to the surface of the diaphragm is $n\lambda/2$ ($\lambda$ is vibrating wavelength and n is a natural number).

3. The apparatus for levitating objects according to claim 1, wherein the transducer vibrates the diaphragm to generate a standing wave in the diaphragm.

4. The apparatus for levitating objects according to claim 1, wherein at least one of the first end portion and the second end portion is chamfered or processed in an arc.

5. The apparatus for levitating objects according to claim 1, wherein a groove is formed in the diaphragm to extend in a longitudinal direction of the diaphragm.

6. The apparatus for levitating objects according to claim 5, wherein the groove is formed on a lower surface of the diaphragm.

7. The apparatus for levitating objects according to claim 1, wherein a slit is formed in the horn to extend in a vibration direction.

8. The apparatus for levitating objects according to claim 1, wherein the transducer vibrates the diaphragm to generate a traveling wave in the diaphragm.

9. The apparatus for levitating objects according to claim 1, wherein each of the horn and the supporting member is fixed to an inner portion from an edge of the corresponding end portion of the diaphragm.

10. An object transporting mechanism for transporting an object in a predetermined transporting direction, wherein the mechanism supports the object with two ends of the object in a direction perpendicular to the transporting direction, and has an apparatus for levitating objects for preventing deflection of an object by applying levitating force between the two ends of the object supported by the transporting mechanism, wherein the apparatus for levitating objects includes:

an elongated diaphragm having a first end portion and a second end portion;

a horn fixed to the first end portion;

a supporting member fixed to the second end portion; and a transducer connected only to the horn wherein a sound wave is generated in the diaphragm and the transducer vibrates the diaphragm via the horn such that an object is levitated above a surface of the diaphragm by radiation pressure of the generated sound wave.

11. The apparatus for transporting objects according to claim 10, wherein the diaphragm is one of a plurality of diaphragms and the diaphragms are arranged parallel to with each other.

12. The apparatus for transporting objects according to claim 10, wherein the transducer vibrates the diaphragm such that a standing wave is generated in the diaphragm.

13. The apparatus for transporting objects according to claim 10, wherein each of the horn and the supporting member is fixed to an inner portion from an edge of the corresponding end portion of the diaphragm.

* * * * *